US012562650B2

(12) United States Patent
Jose et al.

(10) Patent No.: US 12,562,650 B2
(45) Date of Patent: Feb. 24, 2026

(54) DEAD-TIME CALIBRATION SCHEME FOR ACTIVE CLAMP FLYBACK (ACF) PRIMARY FIELD-EFFECT TRANSISTORS (FET)

(71) Applicant: Cypress Semiconductor Corporation, San Jose, CA (US)

(72) Inventors: Jojy Jose, Singapore (SG); Soon Hwei Tan, Singapore (SG); Hariom Rai, Bangalore (IN); Arun Khamesra, Bangalore (IN)

(73) Assignee: Infineon Technologies Americas Corp., El Segundo, CA (US)

( * ) Notice: Subject to any disclaimer, the term of this patent is extended or adjusted under 35 U.S.C. 154(b) by 395 days.

(21) Appl. No.: 18/341,419

(22) Filed: Jun. 26, 2023

(65) Prior Publication Data

US 2024/0048060 A1     Feb. 8, 2024

Related U.S. Application Data

(60) Provisional application No. 63/395,190, filed on Aug. 4, 2022.

(51) Int. Cl.
H02M 3/335 (2006.01)
H02M 1/00 (2006.01)
(Continued)

(52) U.S. Cl.
CPC ..... H02M 3/33592 (2013.01); H02M 1/0045 (2021.05); H02M 1/083 (2013.01);
(Continued)

(58) Field of Classification Search
CPC .......... H02M 3/22; H02M 3/24; H02M 3/315; H02M 3/335; H02M 3/33507;
(Continued)

(56) References Cited

U.S. PATENT DOCUMENTS

| | | | | |
|---|---|---|---|---|
| 10,651,753 | B1 * | 5/2020 | Khamesra | H02M 7/06 |
| 2020/0059152 | A1 * | 2/2020 | Liu | H02M 3/1588 |
| 2021/0058000 | A1 * | 2/2021 | Ahmed | H02J 7/00 |

OTHER PUBLICATIONS

"Off-Line Battery Charger Circuit", Unitrode Corporation, Texas Instruments Incorporated, 1999, 8 pages.
(Continued)

*Primary Examiner* — Thienvu V Tran
*Assistant Examiner* — Carlos O Rivera-Perez

(57) ABSTRACT

A method comprising controlling operation, by a secondary-side controlled Universal Serial Bus Power Delivery (USB-PD) alternating current to direct current (AC-DC) converter, a low-side field-effect transistor (FET). In response to controlling operation of the low-side FET, the method further includes triggering a zero-cross detection circuit. The method further includes measuring a first period of time between controlling operation of the low-side FET and triggering the zero-cross detection circuit. The method further includes measuring a second period of time between controlling operation of a high-side FET and triggering the zero-cross detection circuit. The method further includes adjusting a third period of time based on the first period of time and the second period of time, wherein the third period of time corresponds to a dead time between controlling operation of the high-side FET and the low-side FET.

20 Claims, 8 Drawing Sheets

(51) Int. Cl.

| | |
|---|---|
| *H02M 1/08* | (2006.01) |
| *H03K 17/10* | (2006.01) |
| *H03K 17/691* | (2006.01) |

(52) U.S. Cl.
CPC ......... *H03K 17/102* (2013.01); *H03K 17/691* (2013.01); *H03K 2217/0063* (2013.01); *H03K 2217/0072* (2013.01)

(58) Field of Classification Search
CPC ......... H02M 3/33515; H02M 3/33523; H02M 3/3353; H02M 3/33538; H02M 3/33546; H02M 3/33553; H02M 3/33569; H02M 3/33576; H02M 3/33592; H02M 1/0003; H02M 1/0025; H02M 1/0045; H02M 1/0048; H02M 1/0054; H02M 1/0058; H02M 1/02; H02M 1/04; H02M 1/047; H02M 1/08; H02M 1/083; H02M 1/32; H02M 1/34–348; H03K 17/10; H03K 17/102; H03K 17/689; H03K 17/691; H03K 2217/00; H03K 2217/0063; H03K 2217/0072; Y02B 70/10
USPC ............. 363/15–21.11, 21.12–21.18, 34, 37, 363/40–43, 50, 55–56.12, 89, 123, 124, 363/131–134; 323/235–238, 266, 323/271–276, 280, 282–287, 351; 361/88, 91.1, 91.7
See application file for complete search history.

(56) References Cited

OTHER PUBLICATIONS

"Off-Line CV/CC ZVS Flyback Integrated Switcher IC with 750 V PowiGaN, Active Clamp Drive and Synchronous Rectification", Power Integrations, Inc., InnoSwitch4-CZ Family, May 2022, 36 pages.

* cited by examiner

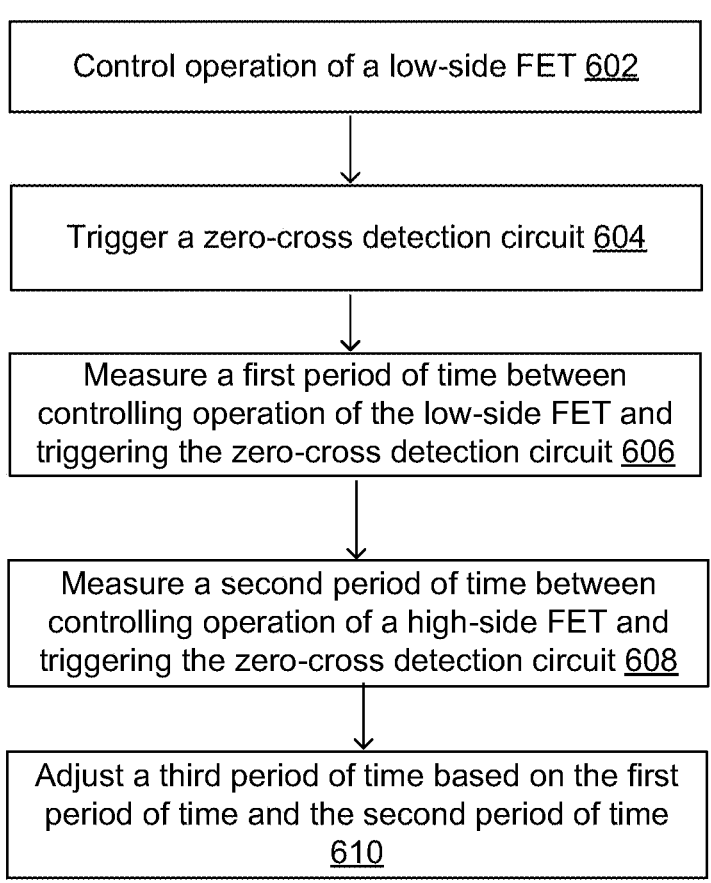

Control operation of a low-side FET 602

Trigger a zero-cross detection circuit 604

Measure a first period of time between controlling operation of the low-side FET and triggering the zero-cross detection circuit 606

Measure a second period of time between controlling operation of a high-side FET and triggering the zero-cross detection circuit 608

Adjust a third period of time based on the first period of time and the second period of time 610

FIG. 6

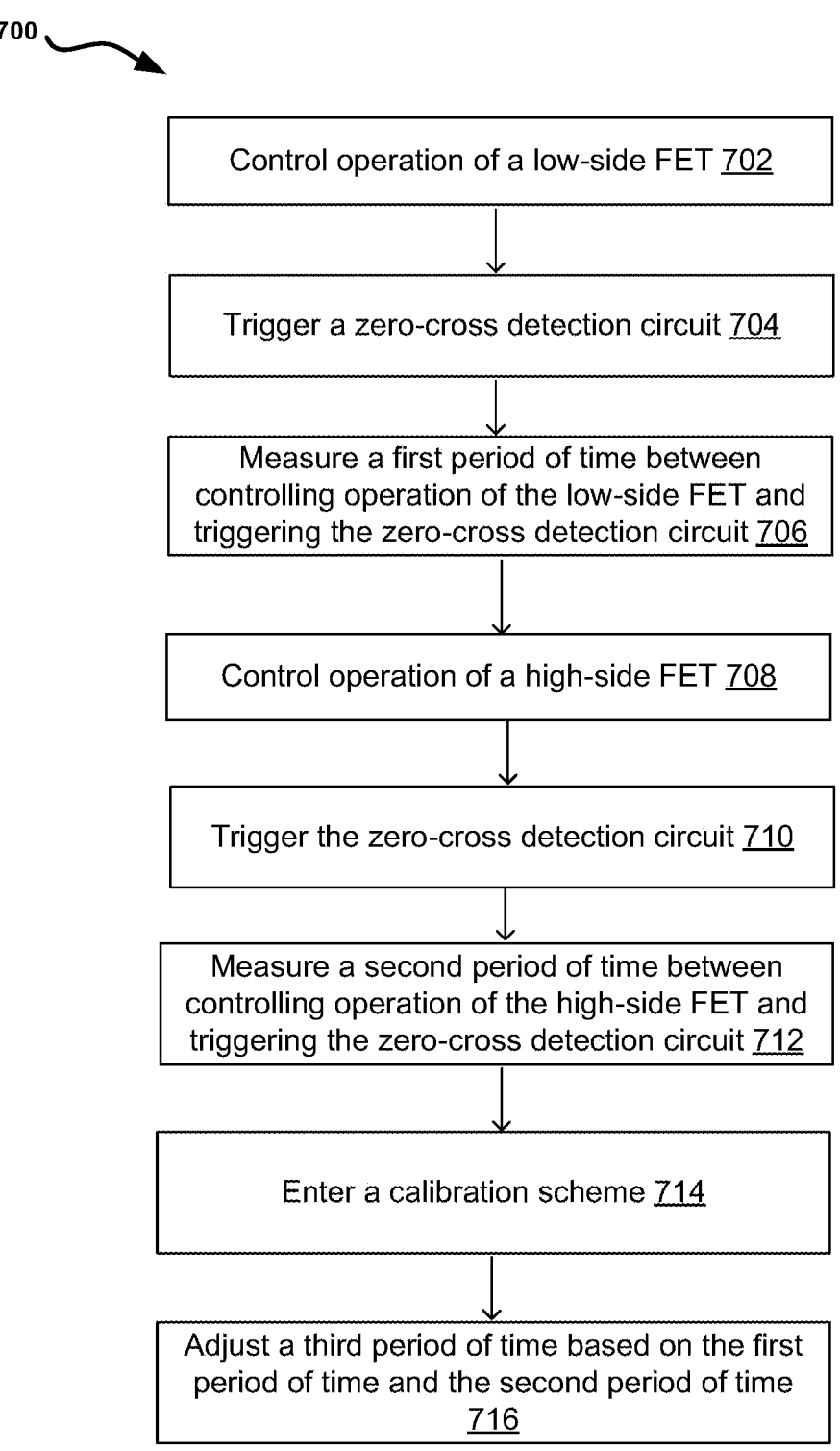

700

Control operation of a low-side FET 702

Trigger a zero-cross detection circuit 704

Measure a first period of time between controlling operation of the low-side FET and triggering the zero-cross detection circuit 706

Control operation of a high-side FET 708

Trigger the zero-cross detection circuit 710

Measure a second period of time between controlling operation of the high-side FET and triggering the zero-cross detection circuit 712

Enter a calibration scheme 714

Adjust a third period of time based on the first period of time and the second period of time 716

FIG. 7

DEAD-TIME CALIBRATION SCHEME FOR ACTIVE CLAMP FLYBACK (ACF) PRIMARY FIELD-EFFECT TRANSISTORS (FET)

PRIORITY

This application claims the priority and benefit of U.S. Provisional Application No. 63/395,190, filed on Aug. 4, 2022, the entire content of which is incorporated by reference herein.

TECHNICAL FIELD

This disclosure relates generally to power adapters or converters, and more particularly to primary adapters or converters with active clamp flyback (ACF) circuits.

BACKGROUND

Various electronic devices (e.g., such as smartphones, tablets, notebook computers, laptop computers, hubs, chargers, adapters, etc.) are configured to transfer power through Universal Serial Bus (USB) connectors according to USB power delivery protocols defined in various revisions of the USB Power Delivery (USB-PD) specification. For example, a power adapter can include an alternating current to direct current (AC-DC) converter, including one or more power-switch (PS) field-effect transistors (FET), such as primary high-side and low-side FETS.

BRIEF DESCRIPTION OF THE DRAWINGS

The disclosure is illustrated by way of example, and not of limitation, in the figures of the accompanying drawings.

FIG. 6 is a flow diagram of a method of providing a dead time calibration scheme for an active clamp flyback primary high-side field-effect transistor (FET) and a primary low-side FET in a secondary-side controlled flyback converter, according to one embodiment.

FIG. 7 is a flow diagram of another method of providing a dead time calibration scheme for an active clamp flyback primary high-side field-effect transistor (FET) and a primary low-side FET in a secondary-side controlled flyback converter, according to one embodiment.

DETAILED DESCRIPTION

Figure 1:
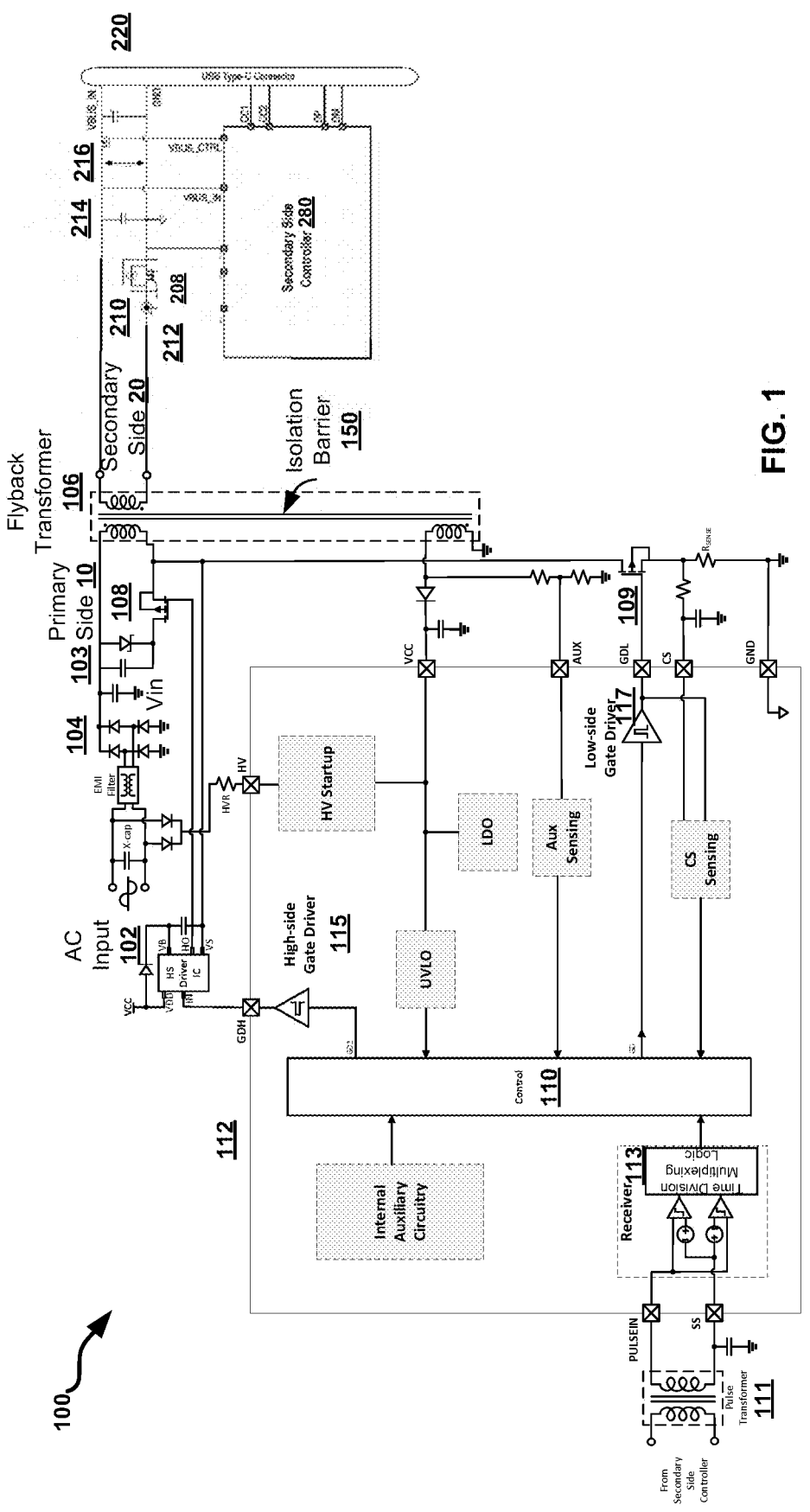
FIG. 1 is a block diagram of an alternating current to direct current (AC-DC) converter, according to one embodiment.

The following description sets forth numerous specific details such as examples of specific systems, components, methods, and so forth, in order to provide a good understanding of various embodiments of the techniques described herein for controlling non-complimentary active clamp flyback (ACF) field-effect transistors (FET), such as used in USB-PD power delivery applications. However, it will be apparent to one skilled in the art that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the invention. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Described herein are various embodiments of techniques for controlling an ACF primary high-side FET and a primary low-side FET in a flyback converter coupled to power lines in electronic devices in USB power delivery (USB-PD). Examples of such electronic devices include, without limitation, personal computers (e.g., laptop computers, notebook computers, etc.), mobile computing devices (e.g., tablets, tablet computers, e-reader devices, etc.), mobile communication devices (e.g., smartphones, cell phones, personal digital assistants, messaging devices, pocket PCs, etc.), connectivity and charging devices (e.g., hubs, docking stations, adapters, chargers, etc.), audio/video/data recording and/or playback devices (e.g., cameras, voice recorders, hand-held scanners, monitors, etc.), and other similar electronic devices that can use USB connectors (interfaces) for communication, battery charging, and/or power delivery. The embodiments described herein can be used for AC-to-DC power adapters, GaN-based power adapters operating at 600 kHz frequencies, power adapters with primary or secondary side controllers, power adapters operating in modes of operations, such as quasi-resonant mode (QR), discontinuous conduction mode (DCM), continuous conduction mode (CCM), or the like. The embodiments described herein can be used in power-adapter solutions along with Type-C PD capability.

A USB-enabled electronic device or a system may comply with at least one release of a USB specification. Examples of such USB specifications include, without limitation, the USB Specification Revision 2.0, the USB 3.0 Specification, the USB 3.1 Specification, and/or various supplements (e.g., such as On-The-Go, or OTG), versions and errata thereof. The USB specifications generally define the characteristics (e.g., attributes, protocol definition, types of transactions, bus management, programming interfaces, etc.) of a differential serial bus that are required to design and build standard communication systems and peripherals. For example, a USB-enabled peripheral device attaches to a USB-enabled host device through a USB port of the host device to form a USB-enabled system. A USB 2.0 port includes a power voltage line of 5V (denoted VBUS), a differential pair of data lines (denoted D+ or DP, and D− or DN), and a ground line for power return (denoted GND). A USB 3.0 port also provides the VBUS, D+, D−, and GND lines for backward compatibility with USB 2.0. In addition, to support a faster differential bus (the USB SuperSpeed bus), a USB 3.0 port also provides a differential pair of transmitter data lines (denoted SSTX+ and SSTX—), a differential pair of receiver data lines (denoted SSRX+ and SSRX—), a power line for power (denoted DPWR), and a ground line for power return (denoted DGND). A USB 3.1 port provides the same lines as a USB 3.0 port for backward compatibility with USB 2.0 and USB 3.0 communications. Still, it extends the performance of the SuperSpeed bus by a collection of features referred to as Enhanced SuperSpeed.

A more recent technology for USB connectors, called USB Type-C, is defined in various releases and/or versions of the USB Type-C specification (e.g., such as Release 1.0, Release 1.1, etc.). The USB Type-C specification defines Type-C receptacles, Type-C plugs, and Type-C cables that can support USB communications as well as power delivery over newer USB power delivery protocols defined in various revisions/versions of the USB-PD specification. Examples of USB Type-C functions and requirements may include, without limitation, data and other communications according to USB 2.0 and USB 3.0/3.1/3.2, electro-mechanical definitions and performance requirements for Type-C cables, electro-mechanical definitions and performance requirements for Type-C receptacles, electro-mechanical definitions and performance requirements for Type-C plugs, requirements for Type-C to legacy cable assemblies and adapters, requirements for Type-C-based device detection and interface configuration, requirements for optimized power delivery for Type-C connectors (also referred to as USB-C connector), etc. According to the USB Type-C specification(s), a Type-C port provides VBUS, D+, D−, GND, SSTX+, SSTX—, SSRX+, and SSRX− lines, among others. In addition, a Type-C port also provides a Sideband Use (denoted SBU) line for signaling of sideband functionality and a Configuration Channel (denoted CC) line for discovery, configuration, and management of connections across a Type-C cable. A Type-C port may be associated with a Type-C plug and/or a Type-C receptacle. The Type-C plug and the Type-C receptacle are designed as reversible pairs that operate regardless of the plug-to-receptacle orientation for ease of use. Thus, a standard USB Type-C connector, disposed as a standard Type-C plug or receptacle, provides pins for four VBUS lines, four ground return (GND) lines, two D+ lines (DP1 and DP2), two D− lines (DN1 and DN2), two SSTX+ lines (SSTXP1 and SSTXP2), two SSTX− lines (SSTXN1 and SSTXN2), two SSRX+ lines (SSRXP1 and SSRXP2), two SSRX− lines (SSRXN1 and SSRXN2), two CC lines (CC1 and CC2), and two SBU lines (SBU1 and SBU2), among others.

Some USB-enabled electronic devices may be compliant with a specific revision and/or version of the USB-PD specification (e.g., such as Revision 1.0, Revision 2.0, etc., or later revisions/versions thereof). The USB-PD specification defines a standard protocol designed to enable the maximum functionality of USB-enabled devices by providing more flexible power delivery along with data communications over a single USB Type-C cable through USB Type-C ports. The USB-PD specification also describes the architecture, protocols, power supply behavior, parameters, and cabling necessary for managing power delivery over USB Type-C cables at up to 100 W of power. According to the USB-PD specification, devices with USB Type-C ports (e.g., USB-enabled devices) may negotiate for more current and/or higher or lower voltages over a USB Type-C cable than are allowed in older USB specifications (e.g., the USB 2.0 Specification, USB 3.1 Specification, the USB Battery Charging Specification Rev. 1.1/1.2, etc.). For example, the USB-PD specification defines the requirements for a power delivery contract (PD contract) that can be negotiated between a pair of USB-enabled devices. The PD contract can specify both the power level and the direction of power transfer that both devices can accommodate and can be dynamically re-negotiated (e.g., without device un-plugging) upon request by either device and/or in response to various events and conditions, such as power role swap, data role swap, hard reset, failure of the power source, etc.

According to the USB-PD specification, an electronic device is typically configured to deliver power to another device through a power path configured on a USB VBUS line. The device that provides power is typically referred to as (or includes) a "provider" (or a power source), and the device that consumes power is typically referred to as (or includes) a "consumer" (or a power sink). A power path typically includes a power switch coupled inline on the VBUS line and configured to turn power delivery on and off.

A USB-PD power source may be configured to draw power from an alternating current (AC) power adapter or another AC source. Thus, as part of an alternating current-to-direct current (AC-DC) conversion, some implementations may use a large bulk capacitor on the power source side of the VBUS line to remove the power signal's AC component. Turn-ON and turn-OFF of power switches (also called power FETs) may allow for further circuit protection based on analysis of current and voltage conditions and the detection of faults.

In one flyback converter, primary low-side FET zero voltage switching (ZVS) can be realized through active clamp flyback (ACF) topology by utilizing energy stored in the active clamp circuit. For example, when the primary high-side FET switches from on to off, previously reverse-magnetized inductance can resonate with the output capacitance ($C_{oss}$) of the primary low-side FET, which can, in turn, lower the primary low-side FET's drain voltage before the next primary FET switch-on cycle. However, the timing to turn on the primary low-side FET at the lowest drain voltage point to achieve optimum efficiency with ZVS through the aforementioned method is not fixed but depends on various factors, including the FET drivers' delay, operation mode (Continuous Conduction Mode (CCM) and/or Discontinuous Conduction Mode (DCM)), the time when the primary high-side FET switches on, primary transformer inductance, input voltage, etc. In some instances, using secondary controlled topology can resolve many of the aforementioned issues. However, there is still a cross-conduction risk due to the existence of both high-side and low-side FETs on the primary side. A solution can be to use external resistors to set a fixed dead-time between switching on and off between the primary high-side FET and the primary low-side FET.

However, this can require extra pins and bills of material (BOM). This solution can also be ineffective due to the variation in the drivers' timing.

Described herein are various embodiments of techniques for improving efficiency by providing a new primary high-side and low-side FET dead-time calibration scheme without using any additional board components or pins, which can be extended to alike systems. In this scheme, a secondary-side controlled alternating current to direct current (AC-DC) converter can first turn on a primary low-side FET without the primary high-side FET being turned on in the previous cycle. Turning on the primary low-side FET can trigger secondary side synchronous rectification (SR) zero-cross detection (ZCD) due to the falling down of the primary low-side FET's drain voltage. The timing difference between turning on the primary low-side FET and triggering zero-cross detection can be measured and stored. In some embodiments, the secondary side can turn off the primary high-side FET. Turning off the primary high-side FET can trigger secondary side SR drain zero-cross detection due to the previously reverse-magnetized inductance that can reso-nate with the output capacitance (C oss) of the primary low-side FET, which can, in turn, lower the primary low-side FET's drain voltage. The timing difference between turning off the primary high-side FET and triggering zero-cross detection can be measured and stored. In some embodiments, the secondary side can derive, based on the timing information measured and stored, the primary high-side FET off to primary low-side FET on dead-time required to avoid cross-conduction, and a target (e.g., optimum) timing for zero voltage switching (ZVS) where the primary low-side FET can turn on at the lowest point of primary drain voltage (e.g., to improve efficiency). In some embodi-ments, the secondary side can deplete the energy stored at the active clamp circuit and activate a primary high-side and low-side FET dead-time calibration scheme, where the sec-ondary side can adjust the primary high-side FET off to primary low-side FET on dead-time according to the timing information obtained previously as described above. With this scheme, a non-complementary active clamp flyback with optimum zero-voltage switching (ZVS) time-to-zero topology can be realized without additional pins and/or BOM.

FIG. 1 is a block diagram of an alternating current to direct current (AC-DC) converter 100, according to an embodiment of the present disclosure. The AC-DC con-verter 100 can be part of an AC-DC power adapter device. The AC-DC converter can include a flyback transformer 106, a pulse edge transformer 111, a primary high-side FET 108, a primary low-side FET 109, a primary-side controller 112, and a secondary-side controller 280.

The AC-DC converter 100 can be a flyback AC-DC converter that provides galvanic isolation between the AC input 102 and a DC output. The AC-DC converter 100 includes a primary side 10 disposed on the AC input side of the flyback transformer 106, and a secondary side 20 dis-posed on the DC output side of the flyback transformer 106. An isolation barrier 150 electrically isolates the primary side 10 from the secondary side 20.

Referring to FIG. 1, the primary side 10 of AC-DC converter 100 includes the AC input 102, a bridge rectifier 104, the flyback transformer 106, the primary high-side FET 108, the primary low-side FET 109, a control logic 110, the time division multiplexing logic 113, the high-side gate driver 115, the low-side gate driver 117, and the pulse transformer 111. In various embodiments, the secondary side 20 includes a secondary-side controller 280, a synchronous rectifier (SR) circuit 210 (e.g., an "SR"), a drain node (SR_DRAIN) 212, an output capacitor 214, and a Universal Serial Bus (USB) Type-C connector 220.

In various embodiments, on the primary side 10, the AC input 102 is configured to receive alternating current from a power source, e.g., such as a wall socket (not shown). The bridge rectifier 104 is coupled between an AC input 102 and the flyback transformer 106 to rectify the input voltage received at the AC input 102. An ACF circuit includes the primary high-side FET 108, which is coupled between the bridge rectifier 104 and the flyback transformer 106. The bottom of the left winding of the flyback transformer 106 is coupled to the drain of the primary high-side FET 108. The source of the primary high-side FET 108 is coupled to a terminal of a capacitor 103. One or more terminals of the capacitor 103 are coupled to the bridge rectifier 104. The flyback transformer 106 is coupled to conduct the AC current from bridge rectifier 104, through its primary coil and the primary high-side FET 108, to ground. An input capacitor can be coupled to the output of the bridge rectifier 104 to be charged to an input voltage (Vin) into the primary side 10 of the AC-DC converter 100. In these embodiments, the gate of the primary high-side FET 108 is coupled to the control logic 110 to control the on and off cycles of the flyback transformer 106. In some embodiments, the control logic 110 can be within the primary-side controller 112. In some embodiments, the control logic 110 can be within a separate integrated circuit (IC), which is coupled to a control pin on the primary-side controller 112.

The primary-side controller 112 can be configured to receive one or more pulses from the secondary-side con-troller 280 via the pulse edge transformer 111. The primary-side controller 112 can include a high-side gate driver 115 and a low-side gate driver 117. The one or more pulses can be decoded via a time division multiplexing logic 113 to control the high-side gate driver 115 and/or the low-side gate driver 117.

In various embodiments, the time division multiplexing logic 113 may be implemented as hardware block(s) having one or more circuits that include various electronic compo-nents configured to process analog and/or digital signals and to perform one or more operations in response to control signal(s) and/or firmware instructions executed by a proces-sor or an equivalent thereof. Examples of such electronic components include, without limitation, transistors, diodes, logic gates, state machines, micro-coded engines, and/or other circuit block(s) and analog/digital circuitry that may be configured to control hardware in response to control signals and/or firmware instructions.

In at least some embodiments, on the secondary side 20, the SR circuit 210 is coupled between the secondary coil of flyback transformer 106 and the output capacitor 214. The SR circuit 210 (also referred to herein as the "SR") includes a secondary PS-FET 208 coupled in parallel to a diode, such that when the secondary PS-FET 208 is turned on, induction current flows to drain node 212. The SR circuit 210 is configured to charge the output capacitor 214 (in successive on and off cycles), so that the output capacitor 214 can provide a steady voltage to the DC output 216. The DC output 216 is coupled to the power connector 220. In these embodiments, the secondary-side controller 280 is coupled to the drain node 212 of the SR circuit 210 to sense the voltage (and changes thereof) on the drain node. The sec-ondary-side controller 280 is also coupled to the gate of the secondary PS-FET 208 in the SR circuit 210 to turn the SR circuit 210 on and off (e.g., in respective on and off cycles)

based on voltage peaks, negative voltage, and zero-voltage crossings sensed on the drain node 212.

In at least some embodiments, a feature that determines the efficiency of an AC-DC converter (e.g., such as the AC-DC converter 100) is the operation of the secondary PS-FET switch (e.g., the secondary PS-FET 208) that controls the operation cycles of the SR circuit (e.g., SR circuit 210). In primary-controlled mode, the secondary-side controller (e.g., controller 280) is dependent on the voltage level of the drain node (e.g., SR_DRAIN 212) of the SR circuit 210 since there is no other communication channel from the primary side 10 to the secondary side 20. In a typical operating scenario, the voltage on the SR_DRAIN node goes below −0.2V to indicate to the secondary-side controller 280 to turn on the secondary PS-FET 208. When the voltage on the SR_DRAIN node reaches back to 0V, the secondary-side controller 280 detects this zero-voltage crossing and turns off the secondary PS-FET 208.

Figure 2A:
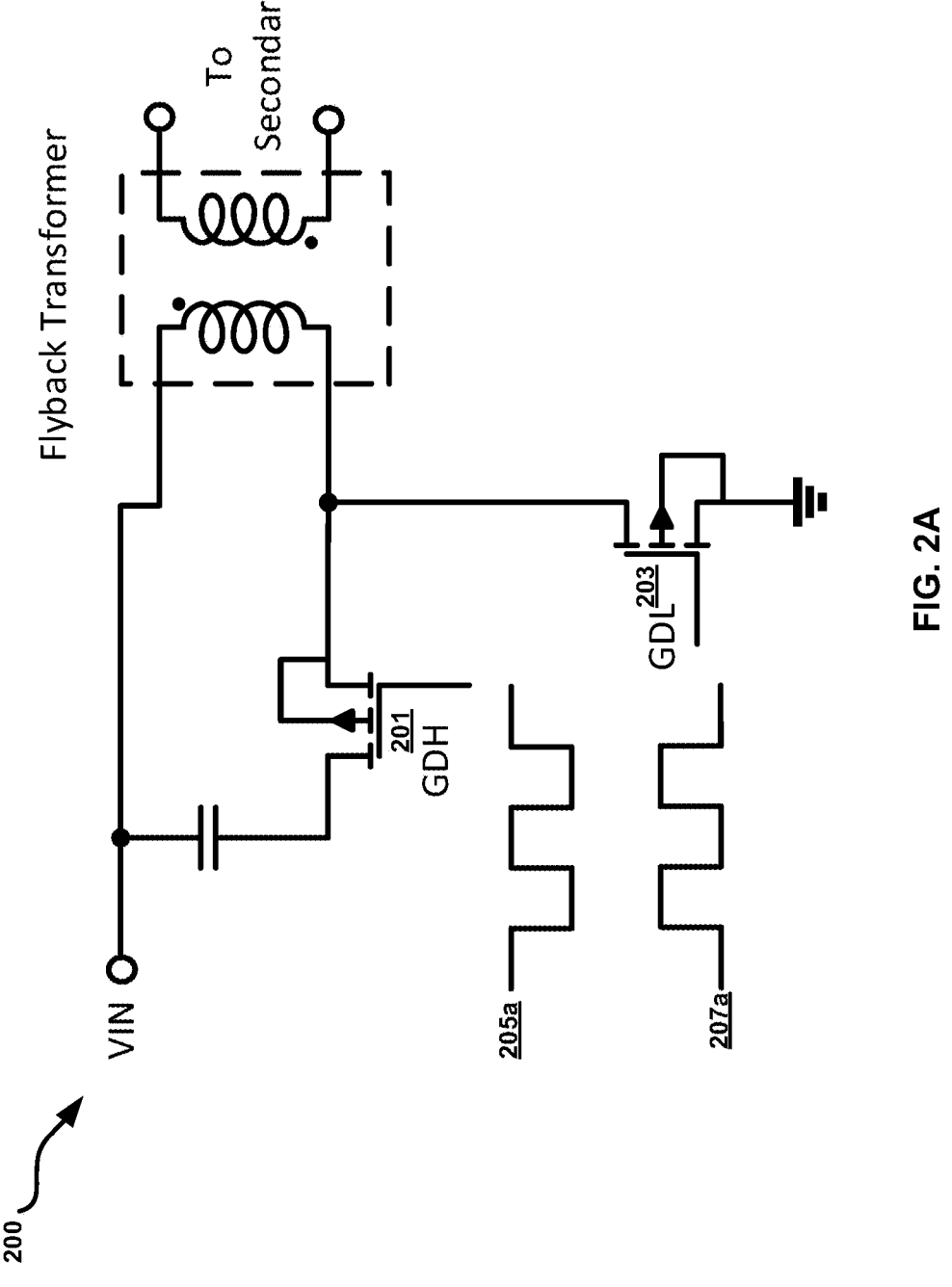
FIG. 2A is a block diagram of a flyback converter with a complementary active clamp flyback, according to one embodiment.

FIG. 2A is a block diagram of a flyback converter 200 with a complementary active clamp flyback, in accordance with some embodiments of the present disclosure. In some embodiments, flyback converters can include clamps that can reduce the voltage stress on the switching components of flyback converters. For example, an active clamp flyback converter is a flyback converter with active clamping. Active clamps have clamp switches (e.g., high-side FETs) that switch to reduce stress on the power switches (e.g., low-side FETs) and recycle leakage energy for higher system efficiency as compared to passive clamps. In some embodiments, an active clamp flyback converter can include a low-side FET 203 that functions as a power switch and a high-side FET 201 that functions as a clamp switch. In some embodiments, the high-side FET 201 can be operated in a complementary active clamp mode, where the high-side FET 201 turns on complementarily to the low-side FET 203 based on load conditions. For example, the high-side FET 201 is turned off at signal 205a, when the low-side FET 203 is turned on at signal 207a.

Figure 2B:
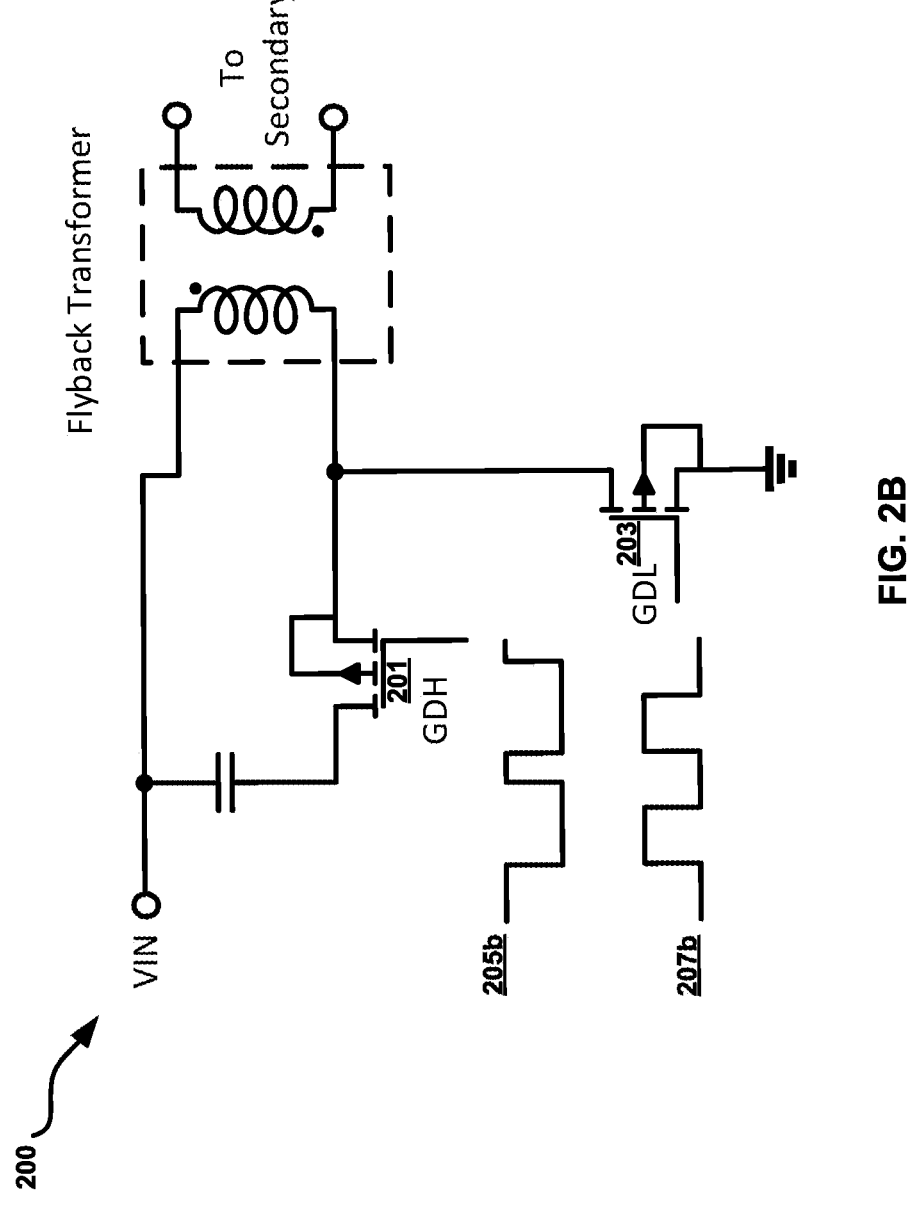
FIG. 2B is a block diagram of a flyback converter with a non-complementary active clamp flyback, according to one embodiment.

FIG. 2B is a block diagram of a flyback converter 200 with a non-complementary active clamp flyback, in accordance with some embodiments of the present disclosure. In some embodiments, flyback converters can include clamps that can reduce the voltage stress on the switching components of flyback converters. For example, an active clamp flyback converter is a flyback converter with active clamping. Active clamps have clamp switches (e.g., high-side FETs) that switch to reduce stress on the power switches (e.g., low-side FETs) and recycle leakage energy for higher system efficiency as compared to passive clamps. In some embodiments, an active clamp flyback converter can include a low-side FET 203 that functions as a power switch and a high-side FET 201 that functions as a clamp switch. In some embodiments, the high-side FET 201 can be operated in a non-complementary active clamp mode, where the high-side FET 201 turns on and off independent of the low-side FET. For example, the high-side FET 201 is turned on and/or off at signal 205b at the same or different time from when the low-side FET 203 is turned on and/or off at signal 207b.

Figure 3:
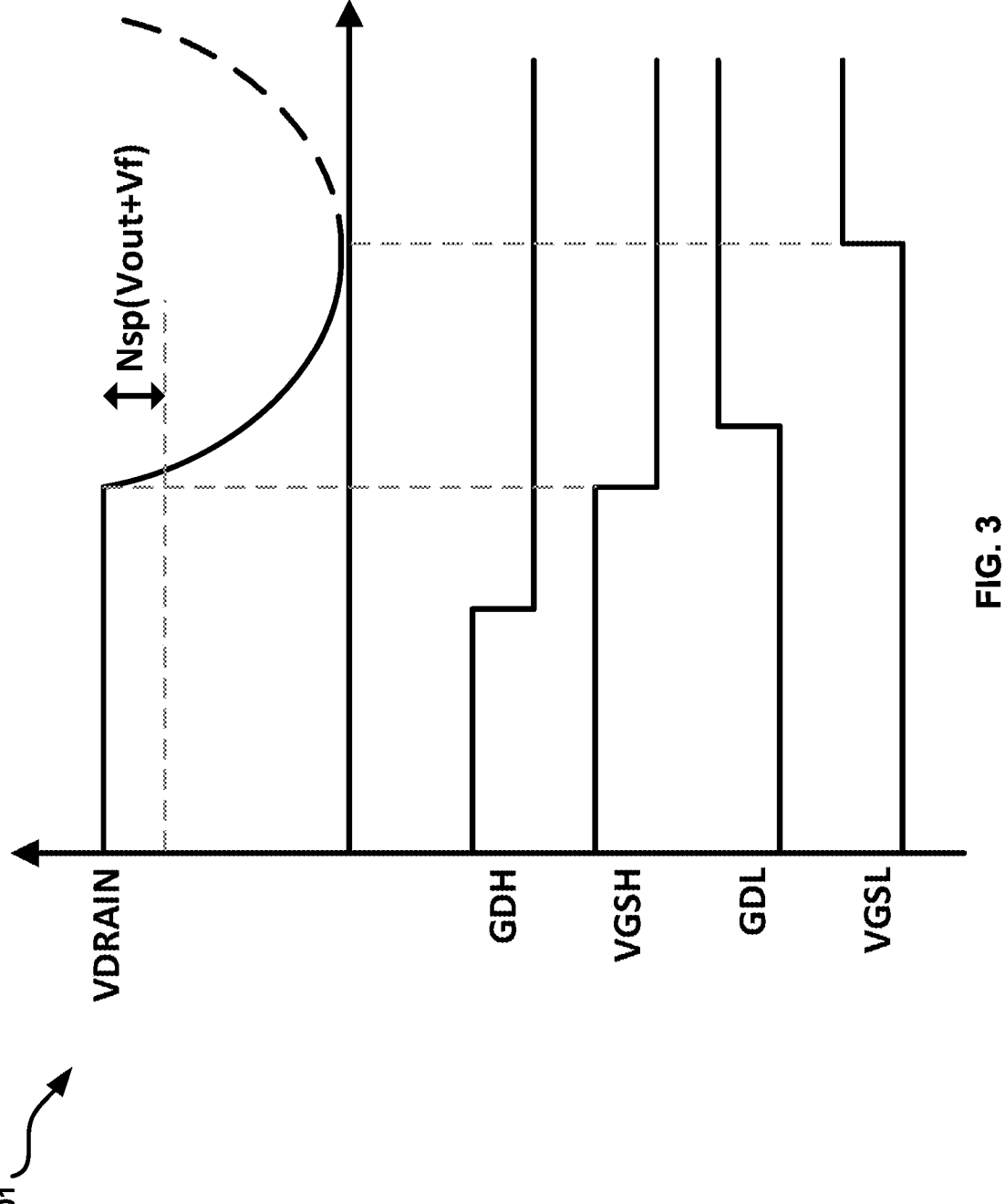
FIG. 3 is a signal flow diagram illustrating pulses of a flyback converter, according to one embodiment.

FIG. 3 is a signal flow diagram illustrating pulses of a flyback converter, in accordance with some embodiments of the present disclosure. The falling edge of the "GDH" signal can indicate that a high-side FET is to be turned off. This can, in turn, trigger a lowering of the gate voltage at the high-side FET, as indicated by the falling edge at the "VGSH" signal. In response to the high-side FET being turned off, a lowering of the drain voltage ("VDRAIN") can be triggered (e.g., due to the previously reverse-magnetized inductance that can resonate with the output capacitance ($C_{oss}$) of the primary low-side FET). The falling edge of the "GDL" signal can indicate that the high-side FET is to be turned off. This can, in turn, trigger an increasing of the gate voltage at the primary low-side FET, as indicated by the rising edge at the "VGSL" signal. In some embodiments, the time for the drain voltage "VDRAIN" to get to zero after turning off the high-side FET control phase can be measured, as described in further detail herein.

Figure 4:
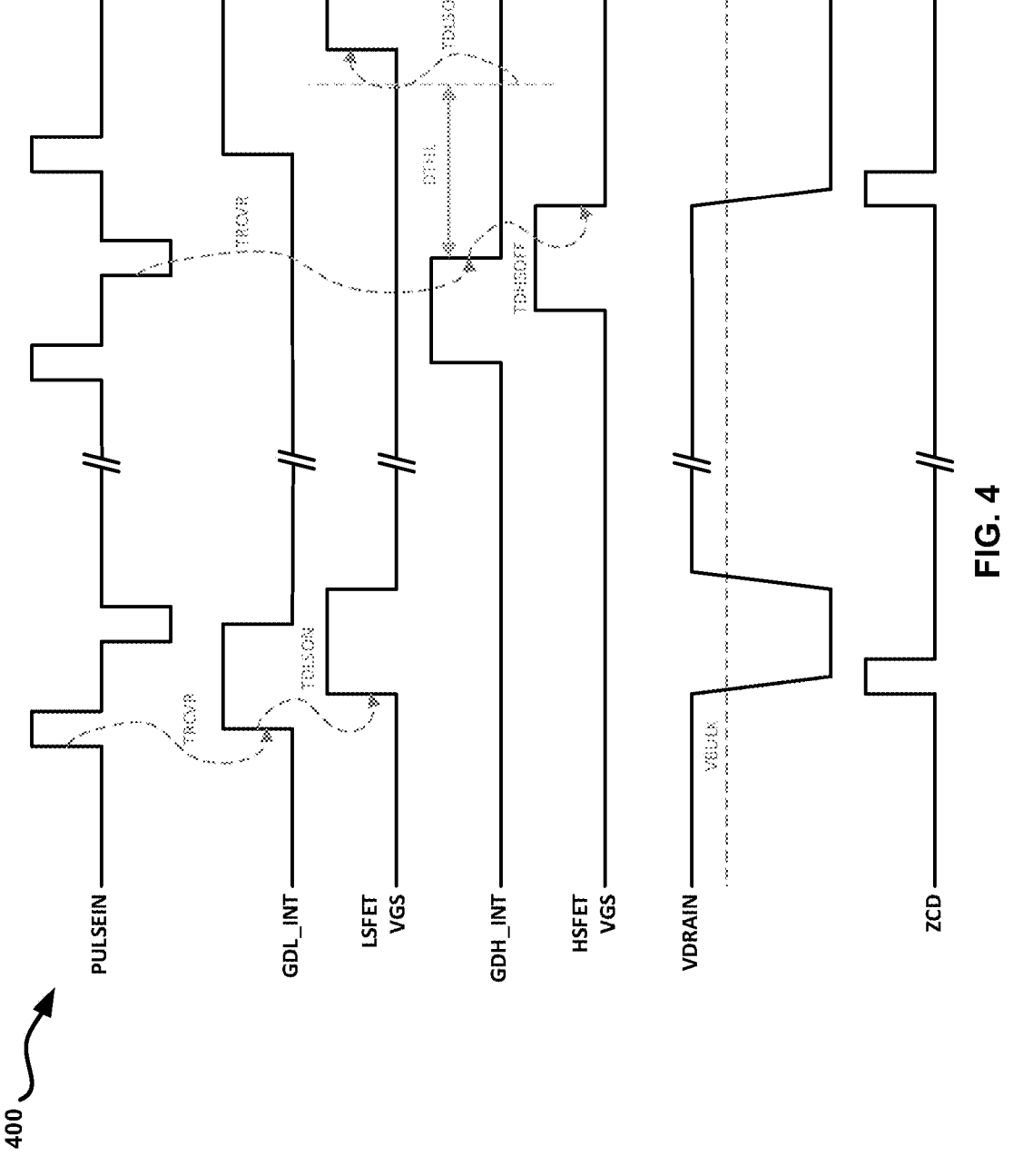
FIG. 4 is a signal flow diagram illustrating pulses of a flyback converter, according to one embodiment.

FIG. 4 is a signal flow diagram illustrating pulses of a flyback converter, in accordance with some embodiments of the present disclosure. A pulse edge transformer driver (PET) can initially detect a positive pulse, which is illustrated with the rising edge at the "PULSEIN" signal. The positive pulse can turn on the low-side FET control phase ("GDL_INT"). In some embodiments, the time between detecting the positive pulse and turning on the low-side FET control phase can be indicated as the value "TRCVR." Subsequently, the low-side FET can be turned on, as indicated by the rising edge at the "LSFET VGS" signal. In some embodiments, the time between turning on the low-side FET control phase and turning on the low-side FET can be indicated as the value "TDLSON." Turning on the low-side FET can, in turn, trigger a lowering of the drain voltage "VDRAIN," as indicated by the falling edge at the VDRAIN signal. The falling edge at the VDRAIN signal can trigger a rising edge at the "ZCD" signal, indicating a zero-cross detection event. The timing from sending the PULSEIN rising edge signal to detection of the ZCD rising edge signal can be measured and represented as "TRCVR+ TDLSON." The PET receiver can detect a negative pulse, illustrated by the falling edge at the PULSEIN signal. The negative pulse can turn off the low-side FET control phase ("GDL_INT"), as indicated by the falling edge at the GDL_INT signal. Subsequently, the low-side FET can be turned off, as indicated by the falling edge at the "LSFET VGS" signal. Turning off the low-side FET can, in turn, trigger an increase in the drain voltage, as indicated by the rising edge at the VDRAIN signal. Subsequently, the PET receiver can detect a positive pulse at the PULSEIN signal, illustrated by the rising edge at the PULSEIN signal. The positive pulse can turn on the high-side FET control phase, as indicated by the rising edge at the GDH_INT signal. The high-side FET can then be turned on, as indicated by the rising edge at the "HSFET VGS" signal. The PET receiver can detect a negative pulse, as illustrated by the falling edge at the PULSEIN signal. The negative pulse can turn off the high-side FET control phase, as indicated by the falling edge at the GDH_INT signal. In some embodiments, the time between the negative pulse and turning off the high-side FET control phase can be indicated as the value "TRCVR." Subsequently, the high-side FET can be turned off, as indicated by the falling edge at the "HSFET VGS" signal. In some embodiments, the time between turning off the high-side FET control phase and turning off the high-side FET can be indicated as the value "TDHSOFF." Turning off the high-side FET can, in turn, trigger a lowering of the drain voltage "VDRAIN," as indicated by the falling edge at the VDRAIN signal (e.g., due to the previously reverse-magnetized inductance that can resonate with the output capacitance ($C_{oss}$) of the primary low-side FET). The falling edge at the VDRAIN signal can trigger a rising edge at the ZCD signal, which can indicate a zero-cross detection event. The timing from sending the PULSEIN falling edge signal to detection of the ZCD rising edge signal can be measured and represented as "TRCVR+TDHSOFF." The PET receiver can subsequently detect another positive pulse, as illustrated by the rising edge at the PULSEIN signal. The positive pulse can turn on the low-side FET control phase, indicated by the rising edge at the GDL_INT signal. Subsequently, the low-side FET can be turned on, as indicated by the rising edge at the "LSFET VGS" signal. In some embodiments, the time between turning off the high-side FET control phase and turning on the low-side FET can be indicated as the value "DTHL."

Figure 5:
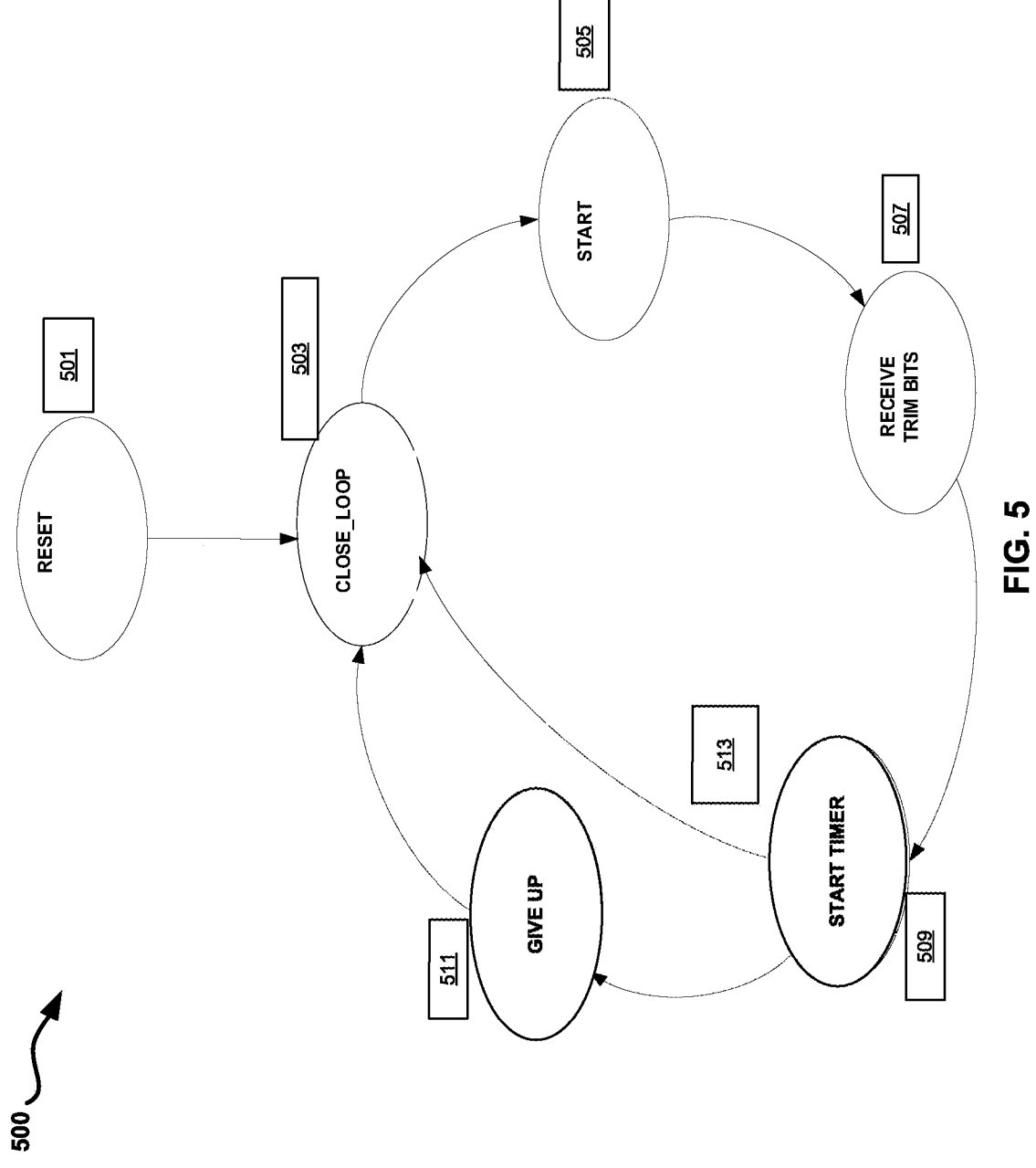
FIG. 5 is a flow diagram of a method of providing a dead time calibration scheme for an active clamp flyback primary high-side field-effect transistor (FET) and a primary low-side FET in a secondary-side controlled flyback converter, according to one embodiment.

FIG. 5 is a flow diagram of a method of providing a dead time calibration scheme for an active clamp flyback primary high-side field-effect transistor (FET) and a primary low-side FET in a secondary-side controlled flyback converter, in accordance with some embodiments of the present disclosure. The method 500 may be performed by processing logic that comprises hardware (e.g., circuitry, dedicated logic, programmable logic, microcode, etc.), software, firmware, or a combination thereof. In one embodiment, a secondary-side controller in an AC-DC flyback converter performs the method 500.

Referring to FIG. 5, the method 500 begins, at block 501, by the processing logic resetting a dead-time calibration scheme for switching between turning off a primary high-side FET control phase to turning on a primary low-side FET control phase (e.g., to avoid cross-conduction). In some embodiments, resetting the dead-time calibration scheme can include setting a default maximum value as a trim value. In some embodiments, the maximum value is a period of time to set as the primary high-side FET off to primary low-side FET on dead-time. In some embodiments, the maximum value can be a period of time determined by the processing logic at the secondary side, as described in detail with respect to FIG. 6. In some embodiments, the trim value is one or more bits (e.g., 4 bits).

At block 503, the processing logic determines, at the secondary-side, whether to enter a dead-time calibration scheme for determining the trim value. In some embodiments, the processing logic determines whether to enter the calibration process based on a predetermined pattern of pulses. In some embodiments, the processing logic can detect, using a pulse edge transformer (PET) receiver, a set of pulses (e.g., four consecutive positive pulses). In response to detecting the set of pulses, the processing logic can start, at block 505, the dead-time calibration scheme.

At block 507, the processing logic can send, to the primary-side, the determined trim value. The primary-side can store the determined trim value for use during turning on/off the high-side FET and low-side FET control phases.

At block 509, the processing logic, at the primary side, can start a timer (e.g., a timer counting down from a maximum period of time, such as 4 milliseconds). At block 511, the processing logic, at the secondary-side, can determine that the trim value is to be adjusted before the timer ends (e.g., before 2 milliseconds), e.g., that there is cross conduction detected between turning off the high-side FET control phase and turning on the low-side FET control phase using the timer set to the trim value. In some implementations, the trim value can be adjusted to the default maximum value. The secondary-side can then return to block 505 using the adjusted trim value. At block 513, the processing logic, at the secondary-side, can determine that the timer is completed (e.g., that the timer completes counting down from the maximum period of time, which can be 4 milliseconds). In response to determining that the timer is completed, the processing logic can return to block 503. The primary-side can store a new trim value in a data structure associated with the flyback converter. The new trim value can be provided by the secondary-side.

FIG. 6 is a flow diagram of a method of providing a dead time calibration scheme for an active clamp flyback primary high-side field-effect transistor (FET) and a primary low-side FET in a secondary-side controlled flyback converter, in accordance with some embodiments of the present disclosure. The method 600 may be performed by processing logic that comprises hardware (e.g., circuitry, dedicated logic, programmable logic, microcode, etc.), software, firmware, or a combination thereof. In one embodiment, a secondary-side controller in an AC-DC flyback converter performs the method 600.

Referring to FIG. 6, the method 600 begins, at block 602, by the processing logic controlling operation of a primary low-side FET (e.g., switch off the low-side FET) of a secondary-side controlled Universal Serial Bus Power Delivery (USB-PD) alternating current to direct current (AC-DC) converter. In some embodiments, a USB-PD AC-DC converter and/or power supply (e.g., a primary-side controller of the USB-PD AC-DC converter and/or power supply) initially controls operation of the primary low-side FET.

At block 604, the processing logic triggers a zero-cross detection circuit. In some embodiments, the zero-cross detection circuit is triggered in response to controlling the operation of the low-side FET (e.g., in response to switching off the low-side FET). In some embodiments, the zero-cross detection circuit is triggered by a secondary-side controller. In some embodiments, the zero-cross detection circuit includes determining that a respective voltage of the low-side FET or the high-side FET reaches zero (e.g., zero voltage).

At block 606, the processing logic measures a period of time (e.g., a first period of time) between controlling operation of the low-side FET and triggering the zero-cross detection circuit. In some embodiments, the secondary-side controller measures the first period of time.

At block 608, the processing logic measures another period of time (e.g., a second period of time) between controlling operation of a primary high-side FET (e.g., switching off the high-side FET) and triggering the zero-cross detection circuit. In some embodiments, the secondary-side controller measures the second period of time.

At block 610, the processing logic adjusting another period of time (e.g., a third period of time) based on the first period of time and the second period of time. In some embodiments, adjusting the third period of time includes computing a difference between the second period of time and the first period of time, and setting a value corresponding to the computed difference as the third period of time. In some embodiments, the third period of time corresponds to a dead time between controlling operation of the high-side FET and the low-side FET. In some embodiments, the third period of time corresponds to an optimum time for zero voltage switching (ZVS) to achieve better system efficiency. In some embodiments, the secondary-side controller adjusts the third period of time. In some embodiments, the secondary-side controller sends the third period of time, e.g., as a trim value (i.e., one or more bits), to the primary-side controller for use in controlling operation of the high-side FET and the low-side FET (e.g., the avoid cross-conduction). The primary-side controller receives the third period of time for use in controlling operation of the high-side FET and the low-side FET.

FIG. 7 is a flow diagram of another method of providing a dead time calibration scheme for an active clamp flyback primary high-side field-effect transistor (FET) and a primary low-side FET in a secondary-side controlled flyback converter, in accordance with some embodiments of the present disclosure. The method 700 may be performed by processing logic that comprises hardware (e.g., circuitry, dedicated logic, programmable logic, microcode, etc.), software, firmware, or a combination thereof. In one embodiment, a secondary-side controller in an AC-DC flyback converter performs the method 700.

Referring to FIG. 7, the method 700 begins, at block 702, by the processing logic controlling operation of a primary low-side FET (e.g., switch off the low-side FET) of a secondary-side controlled Universal Serial Bus Power Delivery (USB-PD) alternating current to direct current (AC-DC) converter. In some embodiments, a USB-PD AC-DC converter and/or power supply (e.g., a primary-side controller of the USB-PD AC-DC converter and/or power supply) initially controls operation of the primary low-side FET.

At block 704, the processing logic triggers a zero-cross detection circuit. In some embodiments, the zero-cross detection circuit is triggered in response to controlling the operation of the low-side FET (e.g., in response to switching off the low-side FET). In some embodiments, the zero-cross detection circuit is triggered by a secondary-side controller. In some embodiments, the zero-cross detection circuit includes determining that a respective voltage of the low-side FET or the high-side FET reaches zero (e.g., zero voltage).

At block 706, the processing logic measures a period of time (e.g., a first period of time) between controlling operation of the low-side FET and triggering the zero-cross detection circuit. In some embodiments, the secondary-side controller measures the first period of time.

At block 708, the processing logic controls operation of a primary high-side FET (e.g., switches off the high-side FET) of the USB-PD AC-DC converter.

At block 710, the processing logic triggers the zero-cross detection circuit. In some embodiments, the zero-cross detection circuit is triggered in response to controlling the operation of the high-side FET (e.g., in response to switching off the high-side FET). In some embodiments, the zero-cross detection circuit is triggered by a secondary-side controller. In some embodiments, the zero-cross detection circuit includes determining that a respective voltage of the low-side FET or the high-side FET reaches zero (e.g., zero voltage).

At block 712, the processing logic measures another period of time (e.g., a second period of time) between controlling operation of the primary high-side FET (e.g., switching off the high-side FET) at block 708 and triggering the zero-cross detection circuit at block 710. In some embodiments, the secondary-side controller measures the second period of time.

At block 714, the processing logic can enter a calibration scheme (e.g., a dead-time calibration scheme as described herein, such as with respect to FIG. 5). At block 716, in response to entering the calibration scheme, the processing logic can adjust another period of time (e.g., a third period of time) based on the first period of time and the second period of time measured at blocks 706 and 712, respectively. In some embodiments, adjusting the third period of time includes computing a difference between the second period of time and the first period of time, and setting a value corresponding to the computed difference as the third period of time. In some embodiments, the third period of time corresponds to a dead time between controlling operation of the high-side FET and the low-side FET. In some embodiments, the third period of time corresponds to an optimum timing for zero voltage switching (ZVS) to achieve better system efficiency, as described herein. In some embodiments, the secondary-side controller adjusts the third period of time. In some embodiments, the secondary-side controller sends the third period of time, e.g., as a trim value (i.e., one or more bits), to the primary-side controller for use in controlling operation of the high-side FET and the low-side FET (e.g., the avoid cross-conduction). The primary-side controller receives the third period of time for use in controlling operation of the high-side FET and the low-side FET.

The embodiments described herein can be implemented in a power delivery system, such as a serial bus-compatible power supply device. An example of a serial bus-compatible power supply device may include a serial bus power delivery (SBPD) device, a USB-compatible power supply device, or the like. In some embodiments, an SBPD device is a USB-PD device that is compatible with the USB-PD standard or more generally with the USB standard. For example, an SBPD device may be used to provide an output voltage (e.g., Vbus_c, power supply voltage) based on an input voltage (e.g., Vbus_in, power supply voltage). The SBPD device may include the various embodiments described herein to facilitate communications between a primary-side controller and a secondary-side controller. The SBPD device may include a power converter (e.g., an AC-DC converter) and a power control analog subsystem (e.g., a USB-PD controller). The power control analog subsystem may include the circuitry, functionality, or both, as described herein for communicating information across a galvanic isolation barrier. The information can include information for different functions, such as over voltage (OV) protection, under voltage (UV) protection, over-current protection (OCP), short circuit protection (SCP), power factor correction (PFC), SR, or the like. The information can include fault information for any of these different functions.

In other embodiments, the SBPD device is connected to a power source, such as a wall socket power source that provides AC power. In other embodiments, the power source may be a different power source, such as a battery, and may provide DC power to the SBPD device. The power converter may convert the power received from the power source (e.g., convert power received to Vbus_in). For example, a power converter may be an AC-DC converter and convert AC power from the power source to DC power. In some embodiments, the power converter is a flyback converter, such as a secondary-side controlled flyback converter, that provides galvanic isolation between the input (e.g., primary side) and the output (e.g., secondary side).

In some embodiments, the SBPD device provides Vbus_c to a sink device (e.g., according to a power delivery contract negotiated via a communication channel (CC) specifying a particular output voltage, and possibly an output current). SBPD device may also provide access to ground potential (e.g., ground) to the sink device. In some embodiments, the providing of the Vbus_c is compatible with the USB-PD standard. Power control analog subsystem may receive Vbus_in from the power converter. The power control analog subsystem may output Vbus_in. In some embodiments, power control analog subsystem is a USB Type-C controller compatible with the USB Type-C™ standard. The power control analog subsystem may provide system interrupts responsive to the Vbus_in and the Vbus_c.

In some embodiments, any of the components of the SBPD device may be part of an IC or alternatively any of the components of the SBPD device may be implemented in its own IC. For example, the power converter and power control analog subsystem may each be discrete ICs with separate packaging and pin configurations.

In some embodiments, the SBPD device may provide a complete USB Type-C™ and USB-Power Delivery port control solution for notebooks, dongles, monitors, docking stations, power adapters, vehicle chargers, power banks, mobile adaptors, and the like.

Embodiments when using isolation or level shifters may require some driver circuit. The driver circuit may be as simple as using a PWM output from the secondary-side controller, to drive a capacitive coupled controller or opto-coupler. The driver circuit can be an elaborate structure when driving a pulse transformer.

In the above description, some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

However, it should be borne in mind that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "adjusting," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts concretely. As used in this application, the term "or" is intended to mean an inclusive "or" rather than an exclusive "or." Unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments described herein may also relate to an apparatus for performing the operations herein. This apparatus may be specially constructed for the required purposes, or it may comprise an integrated circuit (IC) device activated or reconfigured by firmware stored in the device. Such firmware may be stored in a non-transitory computer-readable storage medium, such as, but not limited to, read-only memories (ROMs), random access memories (RAMs), EPROMs, EEPROMs, flash memory, or any type of media suitable for storing electronic instructions. The term "computer-readable storage medium" should be taken to include a single medium or multiple media that store one or more sets of instructions. The term "computer-readable medium" shall also be taken to include any medium capable of storing, encoding, or carrying a set of instructions for execution by the IC device and that causes the device to perform any one or more of the methodologies of the present embodiments. The term "computer-readable storage medium" shall accordingly be taken to include, but not be limited to, solid-state memories, flash memories, and/or any other medium that is capable of storing a set of instructions for execution by the IC device and that causes the device to perform any one or more of the methodologies of the present embodiments.

The algorithms and displays presented herein are not inherently related to any particular device or other apparatus. In addition, the present embodiments are not described with reference to any particular firmware programming language or logic. It will be appreciated that a variety of programming languages or logic may be used to implement the teachings of the embodiments as described herein.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. Therefore, the disclosure scope should be determined with reference to the appended claims, along with the full scope of equivalents to which such claims are entitled.

What is claimed is:

1. A method comprising:
controlling operation, in a secondary-side controlled Universal Serial Bus Power Delivery (USB-PD) alternating current to direct current (AC-DC) converter, of a low-side field-effect transistor (FET);
in response to controlling operation of the low-side FET, triggering a zero-cross detection circuit;
measuring a first period of time between controlling operation of the low-side FET and triggering the zero-cross detection circuit;
measuring a second period of time between controlling operation of a high-side FET and triggering the zero-cross detection circuit; and
adjusting a third period of time based on the first period of time and the second period of time, wherein the third period of time corresponds to a dead time between controlling operation of the high-side FET and the low-side FET.

2. The method of claim 1, wherein the third period of time corresponds to an optimum timing for zero voltage switching.

3. The method of claim 1, wherein the USB-PD AC-DC converter is initially controlling the operation of the low-side FET.

4. The method of claim 1, wherein the triggering of the zero-cross detection circuit comprises determining that a respective voltage of the low-side FET or the high-side FET reaches zero.

5. The method of claim 1, wherein controlling the operation of the low-side FET comprises turning off a control phase of the low-side FET.

6. The method of claim 1, wherein controlling the operation of the high-side FET comprises turning off a control phase of the high-side FET.

7. The method of claim 1, wherein the third period of time is received by a primary-side controller for controlling operation of the high-side FET or the low-side FET.

8. The method of claim 1, wherein the zero-cross detection circuit is performed by a secondary-side controller of the USB-PD AC-DC converter.

9. A Universal Serial Bus Power Delivery (USB-PD) alternating current to direct current (AC-DC) power supply comprising:
   a flyback transformer;
   an active clamp flyback (ACF) circuit;
   a high-side field effect transistor (FET) coupled between the flyback transformer and the ACF circuit;
   a low-side FET coupled to the flyback transformer;
   a pulse transformer;
   a primary-side controller coupled to receive signals from the pulse transformer and to control operation of the high-side FET and the low-side FET; and
   a secondary-side controller, wherein the secondary-side controller is to:
      trigger a zero-cross detection circuit;
      measure a first period of time between controlling operation of the low-side FET and triggering the zero-cross detection circuit;
      measure a second period of time between controlling operation of the high-side FET and triggering the zero-cross detection circuit; and
      adjust a third period of time based on the first period of time and the second period of time, wherein the third period of time corresponds to a dead time between controlling operation of the high-side FET and the low-side FET.

10. The USB-PD AC-DC power supply of claim 9, wherein the USB-PD AC-DC power supply is initially controlling the operation of the low-side FET.

11. The USB-PD AC-DC power supply of claim 9, wherein to trigger the zero-cross detection circuit, the secondary-side controller is further to:
   determine that a respective voltage of the low-side FET or the high-side FET reaches zero.

12. The USB-PD AC-DC power supply of claim 9, wherein to control the operation of the low-side FET, the primary-side controller is further to:
   turn off a control phase of the low-side FET.

13. The USB-PD AC-DC power supply of claim 9, wherein to control the operation of the high-side FET, the primary-side controller is further to:
   turn off a control phase of the high-side FET.

14. The USB-PD AC-DC power supply of claim 9, wherein the primary-side controller is further to:
   receive the third period of time from the secondary-side controller for controlling operation of the high-side FET or the low-side FET.

15. The USB-PD AC-DC power supply of claim 9, wherein the secondary-side controller is further to:
   send the third period of time to the primary-side controller for controlling operation of the high-side FET or the low-side FET.

16. A Universal Serial Bus Power Delivery (USB-PD) flyback converter system, the system comprising:
   a flyback transformer;
   an active clamp flyback (ACF) circuit;
   a high-side field-effect transistor (FET) coupled between the flyback transformer and the ACF circuit;
   a low-side FET coupled to the flyback transformer;
   a pulse transformer;
   a primary-side controller coupled to receive signals from the pulse transformer and to control operation of the high-side FET and the low-side FET; and
   a secondary-side controller, wherein the secondary-side controller is to:
      trigger a zero-cross detection circuit;
      measure a first period of time between controlling operation of the low-side FET and triggering the zero-cross detection circuit;
      measure a second period of time between controlling operation of a high-side FET and triggering the zero-cross detection circuit; and
      adjust a third period of time based on the first period of time and the second period of time, wherein the third period of time corresponds to a dead time between controlling operation of the high-side FET and the low-side FET.

17. The system of claim 16, wherein to trigger the zero-cross detection circuit, the secondary-side controller is further to:
   determine that a respective voltage of the low-side FET or the high-side FET reaches zero.

18. The system of claim 16, wherein to control the operation of the low-side FET, the primary-side controller is further to:
   turn off a control phase of the low-side FET.

19. The system of claim 16, wherein to control the operation of the high-side FET, the primary-side controller is further to:
   turn off a control phase of the high-side FET.

20. The system of claim 16, wherein the primary-side controller is further to:
   receive the third period of time from the secondary-side controller for controlling operation of the high-side FET or the low-side FET.

* * * * *